US007012273B2

(12) United States Patent
Chen

(10) Patent No.: US 7,012,273 B2
(45) Date of Patent: Mar. 14, 2006

(54) PHASE CHANGE MEMORY DEVICE EMPLOYING THERMAL-ELECTRICAL CONTACTS WITH NARROWING ELECTRICAL CURRENT PATHS

(75) Inventor: Bomy Chen, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/641,431

(22) Filed: Aug. 14, 2003

(65) Prior Publication Data

US 2005/0035342 A1 Feb. 17, 2005

(51) Int. Cl.
*H01L 47/00* (2006.01)

(52) U.S. Cl. ....................... 257/4; 257/2; 257/3; 257/5; 257/296; 257/308; 257/309

(58) Field of Classification Search .................... 257/2, 257/3, 4, 5, 296, 308–9; 438/95, 102
See application file for complete search history.

(56) References Cited

U.S. PATENT DOCUMENTS 5,536,947 A 7/1996 Klersy et al.
5,812,441 A * 9/1998 Manning .................... 365/100
5,949,088 A * 9/1999 Morgan ......................... 257/5
6,087,674 A 7/2000 Ovshinsky et al.
RE37,259 E 7/2001 Ovshinsky
6,511,862 B1 1/2003 Hudgens et al.
6,545,287 B1 * 4/2003 Chiang .......................... 257/3
6,566,700 B1 * 5/2003 Xu ............................. 257/296
6,764,894 B1 * 7/2004 Lowrey ...................... 438/238

* cited by examiner

*Primary Examiner*—Tom Thomas
*Assistant Examiner*—Edgardo Ortiz
(74) *Attorney, Agent, or Firm*—DLA Piper Rudnick Gray Cary US LLP

(57) ABSTRACT

A phase changing memory device, and method of making the same, that includes contact holes formed in insulation material that extend down to and exposes source regions for adjacent FET transistors. Spacer material is disposed in the holes with surfaces that define openings each having a width that narrows along a depth of the opening. Lower electrodes are disposed in the holes. A layer of phase change memory material is disposed along the spacer material surfaces and along at least a portion of the lower electrodes. Upper electrodes are formed in the openings and on the phase change memory material layer. For each contact hole, the upper electrode and phase change memory material layer form an electrical current path that narrows in width as the current path approaches the lower electrode, such that electrical current passing through the current path generates heat for heating the phase change memory material disposed between the upper and lower electrodes.

18 Claims, 4 Drawing Sheets

PHASE CHANGE MEMORY DEVICE EMPLOYING THERMAL-ELECTRICAL CONTACTS WITH NARROWING ELECTRICAL CURRENT PATHS

FIELD OF THE INVENTION

The present invention relates to phase change memory devices, and more particularly to phase change memory devices employing narrowing electrical current paths for focusing the application of heat onto selected portions of phase change memory material.

BACKGROUND OF THE INVENTION

There are many types of computer memory technologies that are presently used to store computer programs and data, including dynamic random access memory (DRAM), static random access memory (SRAM), erasable programmable read-only memory (EPROM), and electrically erasable programmable read only memory (EEPROM), etc. Some memory technologies require electrical power to maintain the stored data (i.e. volatile memory), while others do not (i.e. non-volatile memory). Memory technologies can be read only, write once only, or repeatedly read/write.

There is an increasing demand for repeatedly read/write, non-volatile memory. The primary non-volatile memory technology presently used is EEPROM, which utilizes floating gate field effect transistor devices each holding a charge on an insulated "floating gate". Each memory cell can be electrically programmed with a "1" or a "0" by injecting or removing electrons onto or from the floating gate. However, EEPROM memory cells are getting more difficult to scale down to smaller sizes, are relatively slow to read and program, and can consume a relatively large amount of power.

Phase change memory devices have also been known for some time. These devices use materials that can be electrically switched (programmed) between different structured states that exhibit different electrical read-out properties. For example, memory devices made of a chalcogenide material are known, where the chalcogenide material is programmed between a generally amorphous state that exhibits a relatively high resistivity, and a generally crystalline state that exhibits a relatively low resistivity. The chalcogenide material is programmed by heating the material, whereby the amplitude and duration of the heating dictates whether the chalcogenide is left in an amorphous or crystallized state. The high and low resistivities represent programmed "1" and "0" values, which can be sensed by then measuring the resistivity of the chalcogenide material.

FIG. 1A illustrates a memory cell employing chalcogenide phase change memory material. The memory cell includes a layer of chalcogenide 2 disposed between a pair of electrodes 4/6, and over thermal insulator material 8. One of the electrodes (in this case the lower electrode 4) has an increased resistivity making it a thermal heater that heats the chalcogenide layer 2 when an electrical current is passed through the electrodes 4/6 (and through the chalcogenide layer 2). FIG. 1A, for example, shows the chalcogenide 2 in its crystallized form in which the material is highly conductive, and provides a low resistance between electrodes 4/6. When heated by electrode 4 by an amorphousizing thermal pulse, at least a portion 10 of the chalcogenide layer 2 is amorphousized, as shown in FIG. 1B, which increases the electrical resistance of the chalcogenide material. The chalcogenide 2 can by crystallized back to its lower electrical resistance state by applying a crystallization thermal pulse. The electrical resistance of this memory cell can be read using a small electrical current that does not generate enough heat to reprogram the chalcogenide material.

Phase change memory devices have a high program speed (e.g. 200 ns), and exhibit great endurance and program retention. It is even possible to program the phase memory material with varying degrees of amorphousization and thus varying degrees of resistivity, for selecting from three or more values to store in a single memory cell (multi-bit storage).

There is a constant need to shrink down the size of the memory cells. The power needed to program such memory cells is generally proportional to the cross-sectional area and volume of the memory material being amorphousized/crystallized. Thus, reducing the size and volume of the memory material used in each cell reduces the electrical current and power consumption of the memory device. Smaller sized memory cells also means smaller memory arrays, and more space between memory cells for thermal isolation.

Phase change memory devices are typically made by forming blocks of the memory material in holes etched into silicon materials. Thus, the resolution of the lithographic process used to make such holes dictates the dimensions of the memory material blocks in the memory cell. To shrink the cross-sectional area of the memory material blocks even further, it is known to form spacers inside the holes before the memory material blocks are formed. See for example U.S. Pat. No. 6,511,862, which teaches forming spacers over the heating electrode, and then filling the remaining space with a block of the memory material. While this technique reduces the width of the memory material block immediately adjacent the heating electrode, it also results in the formation of the memory material block over just part of the heating electrode, which inefficiently transfers heat to the block of memory material using only part of the electrode's upper surface. This technique also fails to reduce the overall width of the memory cell, as well as effectively reduce the depth of memory material being programmed.

There is a need for a method and memory cell design that increases the heating efficiency of the memory cell, while reducing the size of the memory cells and the amount of memory material "programmed" by the heating process.

SUMMARY OF THE INVENTION

The present invention solves the aforementioned problems by providing a memory cell design that reduces the volume of the programmed phase change memory material, and efficiently focusing generated heat onto that volume of material using a narrowing current path.

The phase change memory device of the present invention includes a substrate, insulation material formed over the substrate and including a hole formed therein, spacer material disposed in the hole and having a surface that defines an opening having a width that narrows along a depth of the opening, a first block of conductive material disposed in the hole and having an upper surface, a layer of phase change memory material disposed in the opening and extending along the spacer material surface and at least a portion of the first block upper surface and a second block of conductive material disposed in the opening and on the phase change memory material layer. The second block of material and the layer of phase change memory material form an electrical current path that narrows in width as the current path approaches the first block upper surface, so that electrical current passing through the current path generates heat for heating the phase change memory material disposed between the first and second blocks.

In another aspect of the present invention, an array of phase change memory devices includes a substrate, insulation material formed over the substrate and including a plurality of holes formed therein, spacer material disposed in each of the holes and having surfaces that define openings having widths that narrow along depths of the openings, a plurality of first blocks of conductive material each disposed in one of the holes and having an upper surface;

phase change memory material that extends along the spacer material surfaces and at least a portion of the first block upper surfaces, and a plurality of second blocks of conductive material each disposed in one of the openings and on the phase change memory material layer. The second blocks of material and the phase change memory material form electrical current paths that narrow in width as each of the current paths approaches one of the first block upper surfaces, so that electrical current passing through the current paths generates heat for heating the phase change memory material.

In yet another aspect of the present invention, a method of making a phase change memory device includes forming insulation material over a substrate, forming a hole in the insulation material, forming spacer material in the hole, wherein the spacer material includes a surface that defines an opening having a width that narrows along a depth of the opening, forming a first block of conductive material in the hole, wherein the first block includes an upper surface, forming a layer of phase change memory material in the opening that extends along the spacer material surface and at least a portion of the first block upper surface, and forming a second block of conductive material in the opening and on the phase change memory material layer. The second block of material and the layer of phase change memory material form an electrical current path that narrows in width as the current path approaches the first block upper surface, so that electrical current passing through the current path generates heat for heating the phase change memory material disposed between the first and second blocks.

In yet one more aspect of the present invention, a method of making an array phase change memory devices includes forming insulation material over a substrate, forming a plurality of holes in the insulation material, forming spacer material in the holes, wherein the spacer material includes surfaces that define a plurality of openings having widths that narrow along depths of the openings, forming a plurality of first blocks of conductive material in the holes, wherein each of the first blocks includes an upper surface, forming phase change memory material in the openings that extends along the spacer material surfaces and at least portions of the first block upper surfaces, and forming a plurality of second blocks of conductive material in the openings and on the phase change memory material. The second blocks of material and the phase change memory material form electrical current paths that narrow in width as each of the current paths approaches one of the first block upper surfaces, so that electrical current passing through the current paths generates heat for heating the phase change memory material.

Other objects and features of the present invention will become apparent by a review of the specification, claims and appended figures.

DETAILED DESCRIPTION OF THE PREFERRED EMBODIMENTS

The present invention is an improved phase change memory device, and method of making such a device, where the volume of the phase change memory material programmed in the memory cell is reduced, and the heat used to program the memory device is efficiently focused onto that volume of material using a narrowing current path having a minimum cross-section adjacent that volume of material.

Figure 1A:
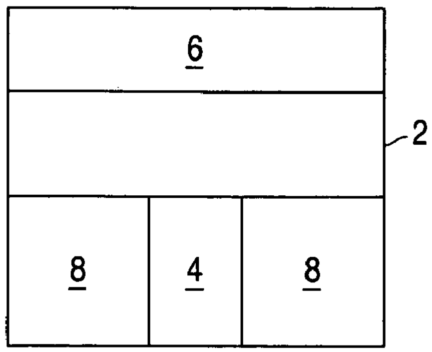
FIG. 1A is a cross-sectional view of a conventional phase change memory device.
Figure 1B:
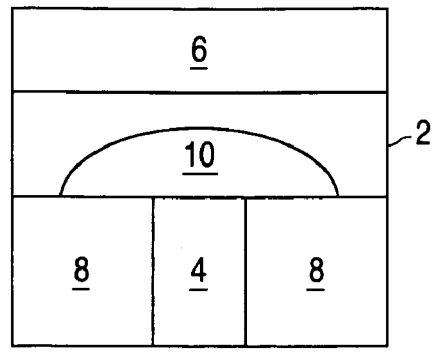
FIG. 1B is a cross-sectional view of the conventional phase change memory device, after undergoing an amorphousizing thermal pulse.

FIGS. 2A to 2F illustrate the formation of the phase change memory cells of the present invention. FIG. 1A illustrates well known MOS FET transistors 20, the formation of which is well known in the art and not described herein in any detail. The MOS FET transistors 20 each include a conductive gate 22 formed over and insulated from a silicon substrate 24. Source and drain regions 26/28 (i.e. first and second regions that are interchangeable) are formed in the substrate 24 and have a conductivity type (e.g. N type) different from that of the substrate 24 (e.g. P type). The channel region 30 of the substrate is defined between the source and drain regions 26/28, and is selectively made conductive ("turned on and off") by varying the voltage on gate 22. Insulation spacers 32 are formed laterally adjacent to the gate 22, and are used to help form LDD (lightly doped) portions of the source and drain regions 26/28, which is well known in the art. Gate 22 and spacers 32 are surrounded by insulation material 34, which is typically formed from one or more layers of insulation materials (e.g. silicon dioxide—"oxide", silicon nitride—"nitride", ILD, etc.).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween). For example, forming an element "over a substrate" can include forming the element directly on the substrate with no intermediate materials/elements therebetween, as well as forming the element indirectly on the substrate with one or more intermediate materials/elements therebetween.

Figure 2A:
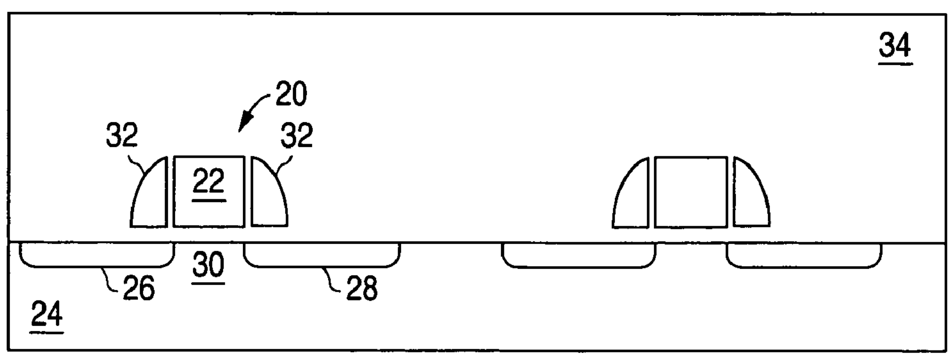
FIGS. 2A to 2F are cross-sectional views illustrating the process of forming the phase change memory device of the present invention.
Figure 2B:
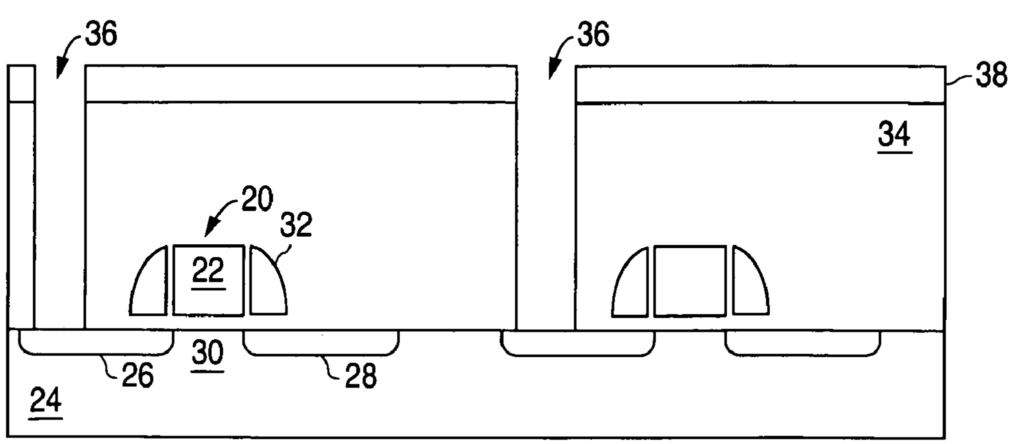

Starting with the structure shown in FIG. 2A, a plurality of memory cells are formed in the following manner, with each memory cell being formed adjacent to one of the transistors 20. Contact holes 36 are formed into the insulation material 34 using a lithographic etch process, where photo resist material 38 is formed over the insulation material 34, and portions thereof are removed to expose selected portions of the insulation material 34. An anisotropic etch process follows, which removes the exposed insulation material 34 to form contact holes 36 that extend down to and expose the source regions 26 of the substrate 24. The resulting structure is shown in FIG. 2B.

Figure 2C:
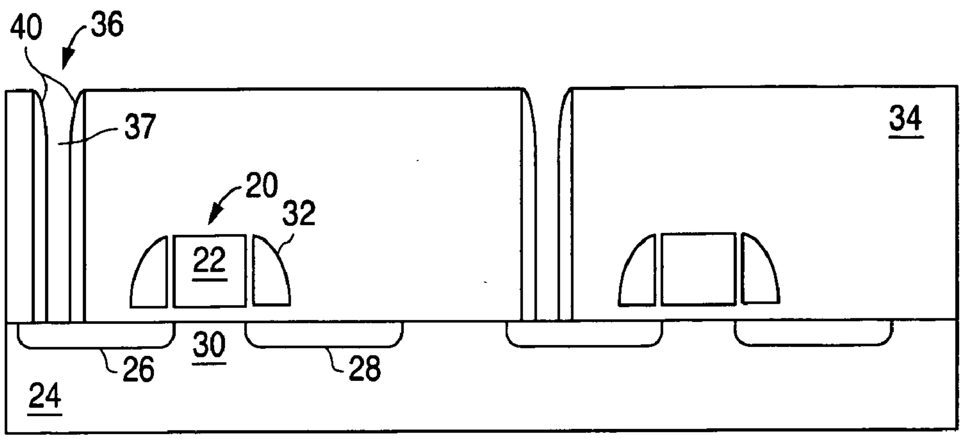

After the photo resist 38 is removed, spacer material 40 is formed in the contact holes 36. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. The upper surface of the spacer material curves downwardly in a generally rounded manner as it extends away from the structure against which it is formed. Thus, when spacers are formed in holes, opposing portions of the spacer material extend toward each other creating a central opening having a width or diameter that decreases with depth (i.e. funnel shaped). Spacer material 40 can be formed of any dielectric material, such as oxide, nitride, ILD, etc. In the present embodiment, spacer material 40 is formed of nitride by depositing a layer of nitride over the entire structure followed by an anisotropic nitride etch process, such as the well known Reactive Ion Etch (RIE), to remove the deposited nitride except for spacer material 40 formed along the sidewalls of contact openings 36, as shown in FIG. 2C. The spacer material defines an opening 37 having a width that narrows with depth, and is less than that defined by the lithographic process that originally formed the contact holes 36 (e.g. by as much as 80% or more).

Figure 2D:
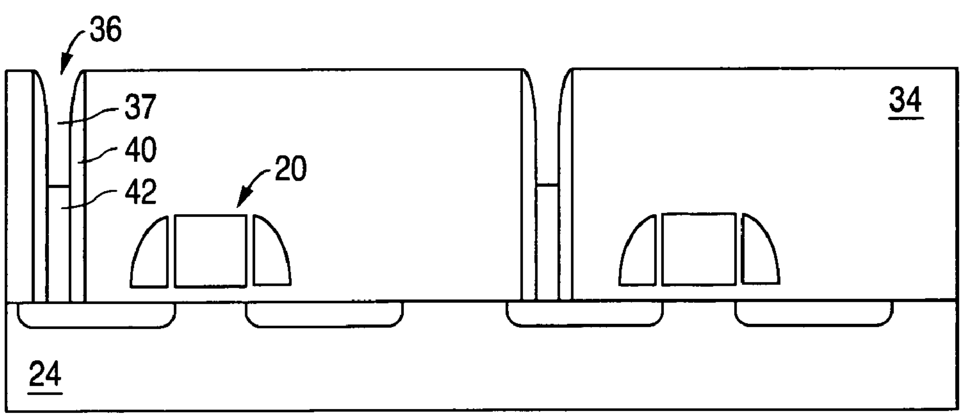
Figure 2E:
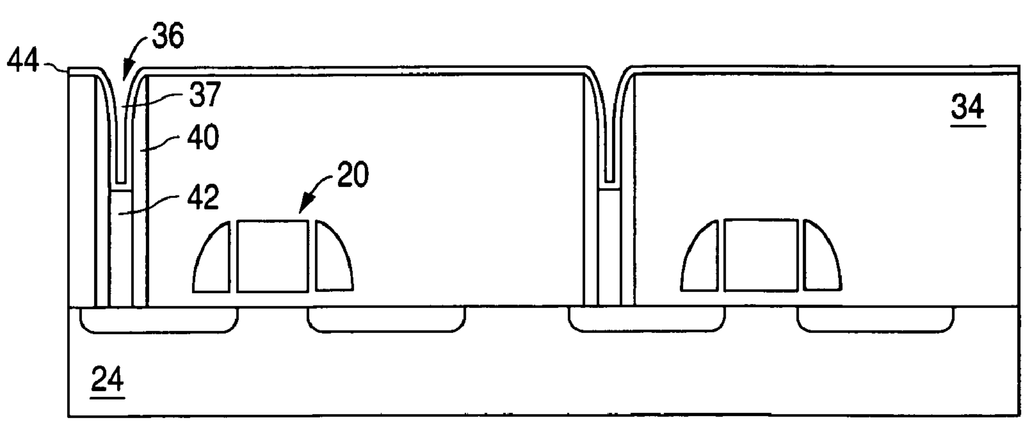

A thick layer of conductive material (e.g. tungsten, titanium-tungsten, etc.) is deposited over the structure, which fills the openings 37 in contact holes 36 with the conductive material. A CMP (chemical-mechanical polishing) etch follows using the top surface of the insulation material 34 as an etch stop, which removes the conductive material except for blocks 42 thereof inside contact holes 36. A controlled etch process is then used to recess the tops of blocks 42 below the top surface of the insulation material 34, as illustrated in FIG. 2D. After the structure is cleaned to remove all etch residue, polymers, etc., a thin layer of phase change memory material 44 (e.g. 100–1000Å thickness) is formed over the structure, including inside openings 37 (along spacer material 40 and on blocks 42), as shown in FIG. 2E. The preferred phase change material is a chalcogenide alloy, which includes at least one Group VI element (e.g. $Ge_2Sb_2Te_5$). For this embodiment, the layer of memory material 44 is preferably thin enough so that it does not merge together as a single vertical column in each contact hole 36 as it extends down to and covers block 42.

Figure 2F:
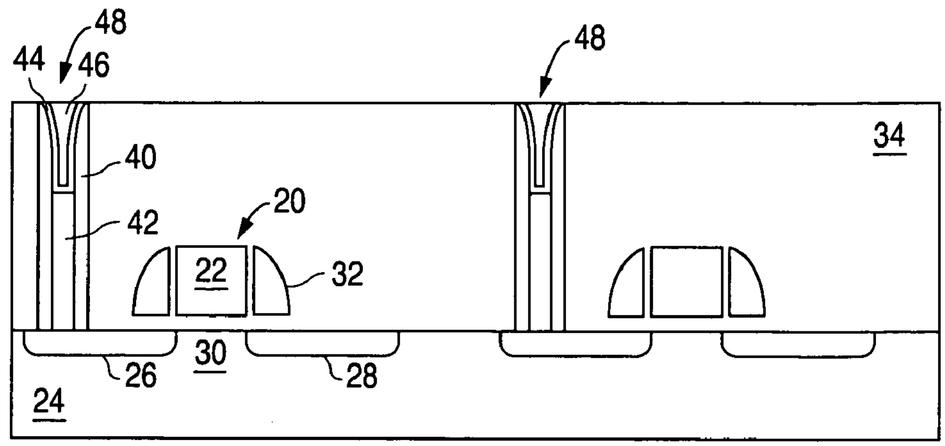

Another thick layer of conductive material (e.g. tungsten, titanium-tungsten, etc.) is deposited over the structure, filling openings 37 in contact holes 36. A CMP etch follows using the top surface of the insulation material 34 as an etch stop, which removes those portions of the conductive material and memory material 44 that are disposed outside of contact holes 36, and results in blocks 46 of the conductive material disposed in contact holes 36 and over memory material layer 44, as shown in FIG. 2F. The resulting structure preferably includes rows of memory cells 48 and their associated transistors 20. The conductive material used to form blocks 46 can be selected and/or doped (e.g. by ion implant or by in-situ process) for increased resistivity, to enhance the heat generated thereby during operation, as explained in further detail below.

Figure 3:
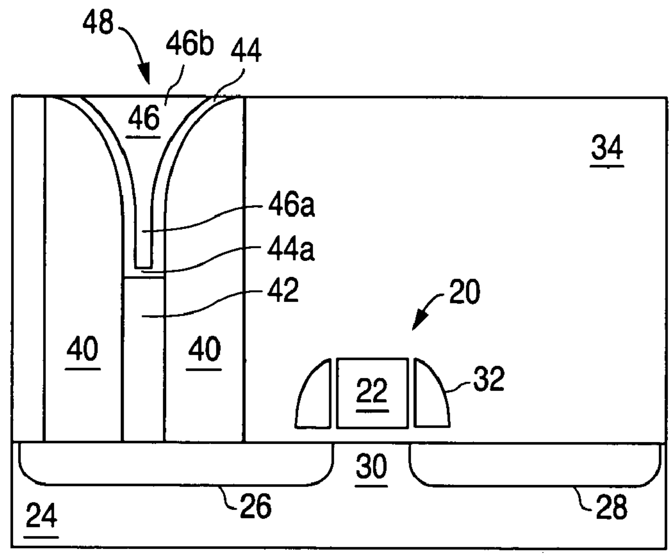
FIG. 3 is a side cross-sectional view of the phase change memory device of the present invention.

FIG. 3 is an enlarged view of a single memory cell 48, and its associated transistor 20. Blocks 42 and 46 constitute the memory cell's lower and upper electrodes, respectively, which are used to program the memory material 44 therebetween. Upper electrode 46 has a width that narrows as it extends down toward the lower electrode 42 (i.e. has a lower portion **46*a* that is narrower than an upper portion 46*b*). This narrowing of the electrode width is caused by the shape of the spacer material 40, against which the memory material layer 44 and upper electrode 46 are formed. The upper electrode 46 (and memory material layer 44 adjacent thereto) define a narrowing current path for the memory cell 48 that reaches its smallest width at the thin layer portion 44*a* disposed directly above the lower electrode 42**.

To program the memory cell 48, a voltage is applied across upper electrode 46 and drain region 28, and a voltage is applied to gate 22 to turn on channel region 30, so that an electrical current pulse of predetermined amplitude and duration flows through transistor 20, lower electrode 42, memory material 44 and upper electrode 46. The electrical current pulse flowing through upper electrode generates heat, which is concentrated in the lower portion **46*a* thereof where there is the greatest current density. The generated heat in turn heats the memory material 44, and in particular the lower portion 44*a* thereof that is disposed between the narrowest portion of upper electrode 46 and lower electrode 42. The memory material lower portion 44*a*** is amorphousized or crystallized depending on the amplitude and duration of the electrical current pulse, as discussed below.

Figure 4:
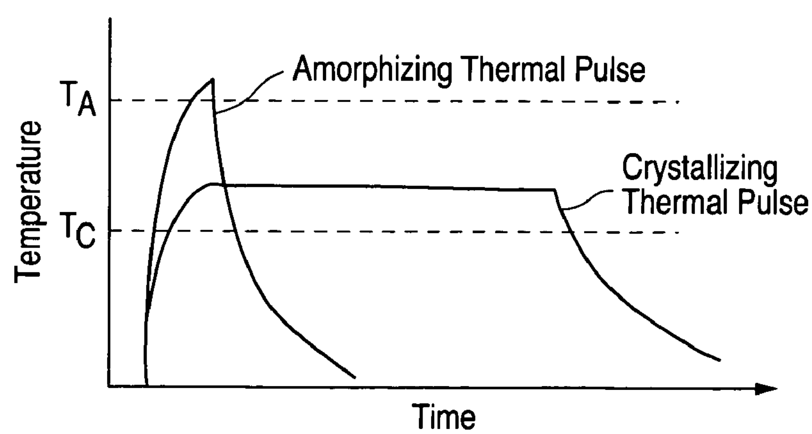
FIG. 4 is a graph illustrating amorphousizing and crystallization of the phase change memory material of the present invention.

FIG. 4 is a graphical representation of how the layer 44 of chalcogenide phase change memory material (and in particular layer portion **44*a*** thereof) is programmed with either a relatively high or relatively low resistivity. To amorphousize the chalcogenide memory material, it is heated to a temperature beyond its amorphousizing temperature $T_A$. Once this temperature is reached, the volume of memory material is rapidly cooled by removing the electrical current flow. So long as the memory material is cooled faster than the rate at which it can crystallize, the memory material is left in a relatively high resistive amorphous state. To crystallize the memory material, it is heated beyond its crystallization temperature $T_C$, and maintained above that temperature for a sufficient time to allow the memory material to crystallize. After such time, the electrical current flow is removed, and the memory material is left in a relatively low resistive crystallized state. It is also possible to vary the thermal pulse amplitude and duration to produce varying degrees of resistivity for multi-bit storage in a single memory cell.

To read the memory cell, an electrical current is passed through the memory cell that has an amplitude and/or duration that is insufficient to program the memory cell, but is sufficient to measure its resistivity. Low or high resistivities (corresponding to crystallized or amorphous states respectively of the memory material 44) represent digital "1" or "0" values (or a range of resistivities representing multiple bits of data). These values are maintained by the memory cells until they are reprogrammed. The memory cells 48 are preferably formed in an array configuration, with the upper electrodes 46, drain regions 28 and gates 22 connected in row or column connection lines, so that each memory cell 48 can be individually programmed and read without disturbing adjacent memory cells.

Using spacers 40 to taper (narrow) down the width of heating electrode 46, and using a thin layer of the programmable memory material disposed at the thin tip of the heating electrode 46, reduces both the width and depth of the programmed memory material in the memory cell, thus reducing the electrical current (and overall power consumption) needed to program the memory device. The narrowing current path defined by the upper electrode 46 produces a maximum current density, and therefore a maximum heat generation, directly adjacent to the memory material to be programmed, which minimizes the amplitude and duration of electrical current needed to program the memory device. Surrounding the heating electrode 46 with spacers 40 also increases the distance (and therefore thermal isolation) between heating electrodes and programming material layers from adjacent cells.

Figure 5:
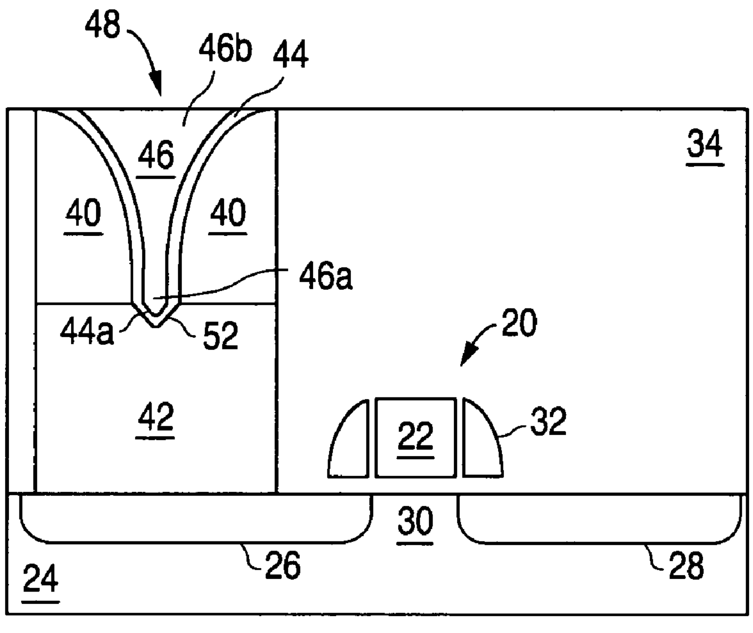
FIG. 5 is a cross-sectional view of an alternate embodiment of the phase change memory device of the present invention.

FIG. 5 illustrates an alternate embodiment of the present invention, where the lower electrode 42 is formed before the formation of the spacers 40. In this embodiment, the lower electrode width is not reduced by the spacers 40. This allows for the optional formation of an indentation 52 into the upper surface of the lower electrode (e.g. by Ar sputtering on the portion of lower electrode 42 left exposed by the spacer material 40 before the formation of the memory material layer). This indentation 52 sharpens the tip of upper electrode lower portion 46*a,* and better focuses the heat generation at the chalcogenide material 44*a* disposed directly in-between this tip and the lower electrode 42.

Figure 6:
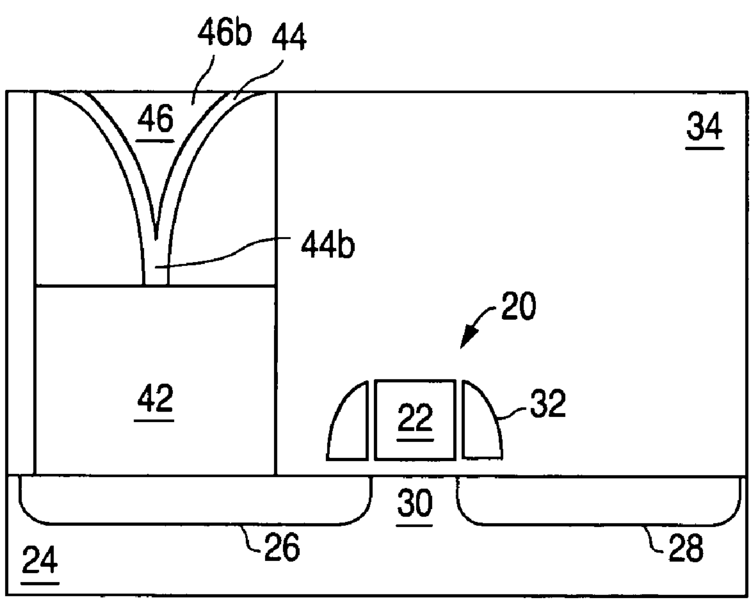
FIG. 6 is a cross-sectional view of a second alternate embodiment of the phase change memory device of the present invention.

FIG. 6 illustrates a second alternate embodiment of the present invention, where the thickness of the chalcogenide layer (compared to the area of the lower electrode 42 left exposed by the spacer material 40) is great enough so that the chalcogenide layer merges to define a narrow column 44*b* of the chalcogenide material directly over the lower electrode 42. The upper electrode 46 and chalcogenide layer 44 define a narrowing current path that reaches a minimum width at the chalcogenide column 44*b*. With this embodiment, the greatest current density in the memory cell 48 is found inside the chalcogenide column 44*b*. Thus, the chalcogenide material that forms column 44*b* heats itself as current passes through the memory cell. In fact, during an amorphousizing thermal pulse, as the chalcogenide heats up and pockets of the chalcogenide material become amorphous, the resistivity of column 44*b* rises, causing even more heat dissipation within the column material.

It is to be understood that the present invention is not limited to the embodiment(s) described above and illustrated herein, but encompasses any and all variations falling within the scope of the appended claims. For example, the contact holes 36 are preferably circular with annular spacer material 40 evenly formed about an open center. However, contact holes can take any shape (elongated, trench-like, elliptical, oval, etc.). The formation of the spacer material 40 can include several successive material deposition/etch processes, to narrow contact hole 36 down to any desired width/diameter. The transistor associated with each memory cell need not be disposed laterally adjacent the memory as shown in the figures, and could even be formed underneath the memory cell between the lower electrode and the substrate. While the upper electrode 46 and chalcogenide layer 44 are formed in opening 37 (and contact hole 36), at least some portions of these elements can extend out of opening/hole 37/36 as well.

What is claimed is:

1. A phase change memory device comprising:

a substrate;

insulation material formed over the substrate and including a hole formed therein;

spacer material disposed in the hole and having a surface that defines an opening having a width that narrows along a depth of the opening;

a first block of conductive material disposed in the hole and having an upper surface;

a layer of phase change memory material disposed in the opening and extending along the spacer material surface and at least a portion of the first block of conductive material upper surface; and a second block of conductive material disposed in the opening and on the phase change memory material layer;

wherein the second block of conductive material and the layer of phase change memory material form an electrical current path that narrows in width as the current path approaches the first block of conductive material upper surface, so that electrical current passing through the current path generates heat for heating the phase change memory material disposed between the first and second blocks;

wherein the substrate is semiconductor material having a first conductivity type, and the memory device further comprises:

first and second spaced-apart regions formed in the substrate and having a second conductivity type, with a channel region defined in the substrate therebetween; and a third block of conductive material disposed over and insulated from the substrate including the channel region;

wherein the first block is disposed over and electrically connected to the first region.

2. A phase change memory device comprising:

a substrate;

insulation material formed over the substrate and including a hole formed therein;

spacer material disposed in the hole and having a surface that defines an opening having a width that narrows along a depth of the opening;

a first block of conductive material disposed in the hole and having an upper surface;

a layer of phase change memory material disposed in the opening and extending along the spacer material surface and at least a portion of the first block of conductive material upper surface; and a second block of conductive material disposed in the opening and on the phase change memory material layer;

wherein the second block of conductive material and the layer of phase change memory material form an electrical current path that narrows in width as the current path approaches the first block of conductive material upper surface, so that electrical current passing through the current path generates heat for heating the phase change memory material disposed between the first and second blocks;

wherein the spacer material is formed over the first block of conductive material upper surface.

3. The phase change memory device of claim 2, wherein the spacer material surface is generally funnel-shaped.

4. The phase change memory device of claim 2, wherein the current path reaches a minimum cross sectional area adjacent the first block of conductive material upper surface.

5. A phase change memory device comprising:
- a substrate;
- insulation material formed over the substrate and including a hole formed therein;
- spacer material disposed in the hole and having a surface that defines an opening having a width that narrows along a depth of the opening;
- a first block of conductive material disposed in the hole and having an upper surface;
- a layer of phase change memory material disposed in the opening and extending along the spacer material surface and at least a portion of the first block of conductive material upper surface; and
- a second block of conductive material disposed in the opening and on the phase change memory material layer;
- wherein the second block of conductive material and the layer of phase change memory material form an electrical current path that narrows in width as the current path approaches the first block of conductive material upper surface, so that electrical current passing through the current path generates heat for heating the phase change memory material disposed between the first and second blocks;
- wherein the spacer material is formed over the first block of conductive material upper surface;
- wherein an indentation is formed into the first block of conductive material upper surface, and a portion of the phase change memory material layer extends into the indentation.

6. The phase change memory device of claim 5, wherein a portion of the second block extends into the indentation.

7. A phase change memory device comprising:
- a substrate;
- insulation material formed over the substrate and including a hole formed therein;
- spacer material disposed in the hole and having a surface that defines an opening having a width that narrows along a depth of the opening;
- a first block of conductive material disposed in the hole and having an upper surface;
- a layer of phase change memory material disposed in the opening and extending along the spacer material surface and at least a portion of the first block of conductive material upper surface; and
- a second block of conductive material disposed in the opening and on the phase change memory material layer;
- wherein the second block of conductive material and the layer of phase change memory material form an electrical current path that narrows in width as the current path approaches the first block of conductive material upper surface, so that electrical current passing through the current path generates heat for heating the phase change memory material disposed between the first and second blocks;
- wherein a lower portion of the phase change memory material layer merges together to form a column of the phase change memory material disposed directly over the first block of conductive material upper surface.

8. The phase change memory device of claim 7, wherein the first block of conductive material is disposed in the opening defined by the spacer material surface.

9. The phase change memory device of claim 7, wherein the current path reaches a minimum cross sectional area at the column.

10. An array of phase change memory devices, comprising:
- a substrate;
- insulation material formed over the substrate and including a plurality of holes formed therein;
- spacer material disposed in each of the holes and having surfaces that define openings having widths that narrow along depths of the openings;
- a plurality of first blocks of conductive material each disposed in one of the holes and having an upper surface;
- phase change memory material that extends along the spacer material surfaces and at least a portion of the first block of conductive material upper surfaces; and
- a plurality of second blocks of conductive material each disposed in one of the openings and on the phase change memory material layer;
- wherein the second blocks of conductive material and the phase change memory material form electrical current paths that narrow in width as each of the current paths approaches one of the first block of conductive material upper surfaces, so that electrical current passing through the current paths generates heat for heating the phase change memory material;
- wherein the substrate is semiconductor material having a first conductivity type, and the array of phase change memory devices further comprises:
  - a plurality of first and second spaced-apart regions formed in the substrate and having a second conductivity type, wherein channel regions of the substrate are defined between the first and second regions; and
  - a plurality of third blocks of conductive material disposed over and insulated from the substrate including the channel regions;
  - wherein the first blocks are disposed over and electrically connected to the first regions.

11. An array of of phase change memory devices, comprising:
- a substrate;
- insulation material formed over the substrate and including a plurality of holes formed therein;
- spacer material disposed in each of the holes and having surfaces that define openings having widths that narrow along depths of the openings;
- a plurality of first blocks of conductive material each disposed in one of the holes and having an upper surface;
- phase change memory material that extends along the spacer material surfaces and at least a portion of the first block of conductive material upper surfaces; and
- a plurality of second blocks of conductive material each disposed in one of the openings and on the phase change memory material layer;
- wherein the second blocks of conductive material and the phase change memory material form electrical current paths that narrow in width as each of the current paths approaches one of the first block of conductive material upper surfaces, so that electrical current passing through the current paths generates heat for heating the phase change memory material;
- wherein the spacer material is formed over the first block of conductive material upper surfaces.

12. The array of claim 11, wherein the spacer material surfaces are generally funnel-shaped.

13. The array of claim 11, wherein the current paths reach minimum cross sectional areas adjacent to the first block of conductive material upper surfaces.

14. An array of phase change memory devices, comprising:

a substrate;

insulation material formed over the substrate and including a plurality of holes formed therein;

spacer material disposed in each of the holes and having surfaces that define openings having widths that narrow along depths of the openings;

a plurality of first blocks of conductive material each disposed in one of the holes and having an upper surface;

phase change memory material that extends along the spacer material surfaces and at least a portion of the first block of conductive material upper surfaces; and a plurality of second blocks of conductive material each disposed in one of the openings and on the phase change memory material layer;

wherein the second blocks of conductive material and the phase change memory material form electrical current paths that narrow in width as each of the current paths approaches one of the first block of conductive material upper surfaces, so that electrical current passing through the current paths generates heat for heating the phase change memory material;

wherein the spacer material is formed over the first block of conductive material upper surface;

wherein indentations are formed into the first block of conductive material upper surfaces, and portions of the phase change memory material extend into the indentations.

15. The array of claim 14, wherein portions of the second blocks extend into the indentations.

16. An array of of phase change memory devices, comprising:

a substrate;

insulation material formed over the substrate and including a plurality of holes formed therein;

spacer material disposed in each of the holes and having surfaces that define openings having widths that narrow along depths of the openings;

a plurality of first blocks of conductive material each disposed in one of the holes and having an upper surface;

phase change memory material that extends along the spacer material surfaces and at least a portion of the first block of conductive material upper surfaces; and a plurality of second blocks of conductive material each disposed in one of the openings and on the phase change memory material layer;

wherein the second blocks of conductive material and the phase change memory material form electrical current paths that narrow in width as each of the current paths approaches one of the first block of conductive material upper surfaces, so that electrical current passing through the current paths generates heat for heating the phase change memory material;

wherein the phase change memory material includes at least one layer of material having a lower portion that merges together to form columns of the phase change memory material disposed directly over the first block of conductive material upper surfaces.

17. The array of claim 16, wherein the first blocks of conductive material are disposed in the openings defined by the spacer material surfaces.

18. The array of claim 16, wherein the current paths reach minimum cross sectional areas at the columns.

* * * * *